United States Patent [19]

Bert

[11] 4,124,828

[45] Nov. 7, 1978

[54] SURFACE WAVE DEVICE FOR TREATING SIGNALS

[75] Inventor: Alain Bert, Paris, France

[73] Assignee: Thomson-CSF, Paris, France

[21] Appl. No.: 776,236

[22] Filed: Mar. 10, 1977

[30] Foreign Application Priority Data

Mar. 16, 1976 [FR] France ............................ 76 074930

[51] Int. Cl.$^2$ ........................ H03H 9/26; H03H 9/30; G06G 7/19; G11C 27/02

[52] U.S. Cl. .................................... 333/30 R; 333/72; 357/15; 357/26; 364/821

[58] Field of Search ................... 333/30 R, 29, 72, 71, 333/70 T, 70 R; 350/161 S, 161 W; 310/313; 330/5.5; 364/821; 357/26, 15, 75; 307/317 R, 317 A, 320

[56] References Cited

U.S. PATENT DOCUMENTS

| | | | |
|---|---|---|---|
| 3,935,564 | 1/1976 | Quate et al. | 333/30 R X |
| 3,975,696 | 8/1976 | Kantorowicz | 333/30 R |
| 3,982,113 | 9/1976 | Coldren | 333/30 R X |

OTHER PUBLICATIONS

Ingebrigtsen et al.–"A Schottky–Diode Acoustic Memory and Correlator", Applied Physics Letters, vol. 26, No. 11, Jun. 1, 1975; pp. 596–598.

Maerfeld et al.–"Acoustic Storage and Processing Device Using P–N Diodes"–Applied Physics Letters, vol. 27, No. 11, Dec. 1, 1975; pp. 577–578.

*Primary Examiner*—Alfred E. Smith
*Assistant Examiner*—Marvin Nussbaum
*Attorney, Agent, or Firm*—Roland Plottel

[57] ABSTRACT

A device for treating electrical signals by correlation or convolution, by means of elastic surface waves. It comprises a semiconductor substrate on which a network of Schottky diodes is formed and which, in one embodiment, is covered by a thin layer of piezoelectric material. The end faces of the device each carry an electrode. The piezoelectric surface carries an electromechanical transducer at each of its ends. This device provides for the memorization of a reference signal applied to one of the transducers and for the correlation or convolution of that signal with a second signal applied to one of the transducers.

23 Claims, 4 Drawing Figures

SURFACE WAVE DEVICE FOR TREATING SIGNALS

This invention relates to the treatment of a signal, for example by correlation or convolution, by means of elastic (or acoustic) waves.

One known method of detecting the presence of a signal with known characteristics in a high noise level is to effect the correlation between this signal and a reference signal which shows said characteristics.

It is known that elastic (or acoustic) wave structures can be used for constructing filters of this type which effect a correlation between a received signal to be identified and a previously memorised reference signal. The particular advantage of these filters is that they can be programmed as required because any reference signal may be memorised. Structures of this type are normally formed by two substrates separated by a thin air gap, namely a piezoelectric substrate and a semiconductor substrate which is arranged opposite the piezoelectric substrate. The semiconductor substrate carries a matrix of diodes, preferably of the Schottky type, on that of its surfaces which is opposite the first substrate, the end faces of the two substrates being provided with electrodes.

This structure operates as follows: the reference signal ($S_R$) is converted into an elastic wave propagated at the surface of the piezoelectric substrate. A voltage pulse ($S_M$) applied between the electrodes enables the reference signal ($S_R$) to be memorised by the accumulation of electrical charges in each of the diodes. The signal to be treated (S) may then be converted into an elastic wave which is propagated at the surface of the piezoelectric substrate. That latter wave interacts non-linearly with the memorised reference signal ($S_R$) to give a resultant signal (P) which is collected between the electrodes and which represents the correlation or convolution of the signals S and $S_R$.

The main disadvantage of this type of structure are, on the one hand, the distance between the two substrates which plays a critical part and which is capable of variation, especially in the event of vibrations or shocks, and on the other hand the high value of the biasing voltage which has to be applied to a structure such as this.

The present invention relates to an electro-acoustic structure for treating signals which enables these disadvantages to be obviated.

According to the invention, there is provided a surface wave device for treating signals, comprising:

- a semiconductor medium having two opposite surfaces, carrying a mosaic of diodes on the first of said surfaces;
- a piezoelectric medium having two opposite surfaces, the first of said surfaces being in contact with said first surface of said semiconductor medium;
- at least a first electromechanical transducer for generating elastic waves capable of being propagated on said piezoelectric medium;
- means for applying a potential difference between the second of said surfaces of the semiconductor medium and the second of said surfaces of the piezoelectric medium, during the propagation of a first signal in said piezoelectric medium so as to memorise that signal by means of said diodes;
- means for converting a second signal into an elastic wave propagated in said piezoelectric medium when said first signal is memorised;
- means for extracting a third signal generated by the interaction of said first and second signals.

A further object of the invention is a surface wave device for treating signals comprising:

- a medium which is both semiconductor and piezoelectric, having two opposite surfaces, said medium carrying a mosaic of diodes on the first of said surfaces;
- at least one electromechanical transducer for generating elastic waves capable of being propagated on said first surface;
- means for applying a potential difference between said two opposite surfaces, during the propagation of a first signal on said medium, so as to memorise said first signal in said diodes;
- means for converting a second signal into an elastic wave propagated on said medium when said first signal is memorised;
- means for extracting a third signal generated by the interaction of said first and second signals.

For a better understanding of the invention and to show how it may be carried into effect, reference will be made to the following description given by way of non-limiting example and illustrated by the accompanying drawings, wherein:

FIG. 1 diagrammatically illustrates the prior art structures.

FIG. 2 diagrammatically illustrates one embodiment of the structure according to the invention.

In these various FIGS., the same references have been used to denote the same elements on the one hand whilst, on the other hand, the true scale has not been observed in the interests of greater clarity.

Figure 1:
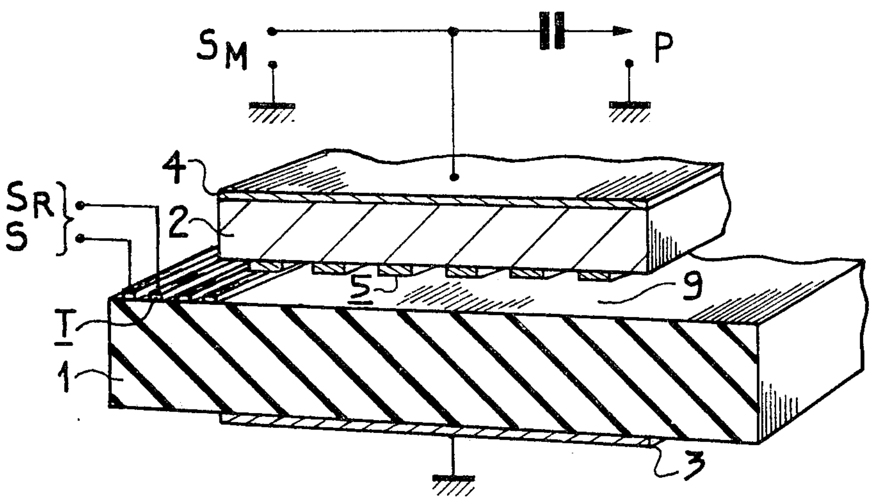
FIG 1 PRIOR ART

The prior art structure illustrated in FIG. 1 comprises:

- a piezoelectric substrate 1 which carries an electrode 3 on its lower surface and at least one electromechanical transducer T on its upper surface;
- a semiconductor substrate 2 which is disposed opposite the upper surface of the piezoelectric substrate 1 but which is separated therefrom by a thin air gap 9 (of which the thickness has been greatly exaggerated in FIG. 1). The upper surface of the substrate 2 carries an electrode 4 whilst its lower surface carries a network of Schottky diodes 5, each of which is formed by a metallic stud deposited onto the semiconductor 2. For example, this latter is made of N-type silicon.

In operation, as is already known, a first electrical signal ($S_R$) is applied as reference signal to the transducer T; accordingly, an elastic wave is propagated at the surface of the piezoelectric substrate 1. When this wave occupies the entire useful surface, or interaction surface, of the substrate 1 (surface opposite the semiconductor 2), a potential difference ($S_M$) is applied between the two electrodes 3 and 4 of the structure so as to memorise the signal $S_R$ by means of the diodes 5.

The memorisation process is the following: a voltage $S_M$ (negative if the semiconductor 2 is of N-type) is applied to the electrode 4, the electrode 3 being for example kept at the reference potential. That voltage $S_M$ biasses the Schottky diodes 5 in the forward direction and causes electrical charges to abound on the metallic electrodes of the diodes. The quantity of charges is proportional to the biassing voltage $S_M$ and the value at each point of the piezoelectric potential present on the substrate 1 which represents the reference signal $S_R$. When the biassing voltage $S_M$ is interrupted, the diodes 5 are biassed in the reverse direction and the blocked electrical charges proportionally create in the semiconductor a depletion zone, depleted with charge carriers, opposite each diode. The signal $S_R$ is thus memorised. It should be noted that, on the one hand, the voltage pulse $S_M$ should be very brief by comparison with the period of the signal $S_R$ to be memorised and, on the other hand, that the spacing of the diodes 5 forming a network should be less than half the mean acoustic wavelength (λ), for example of the order of λ/4.

The memorisation process described above has of course been described purely by way of example and other methods known for the prior-art structures may also be used.

Once the signal $S_R$ has been memorised, the signal S to be treated may be applied to the transducer T. The transducer T converts the signal S into an elastic wave which is propagated at the surface of the piezoelectric substrate 1 and of which the associated electrical field sweeps the semiconductor 2. The interaction between the signals S and $S_R$, while S sweeps the interaction surface, generates an electrical signal P, available between the electrode 3 and 4, which will be shown to be the correlation between the signals $S_R$ and S. It will also be shown that convolution of the signals $S_R$ and S may be obtained by reversing the direction of propagation of one signal for example $S_R$.

Figure 2:
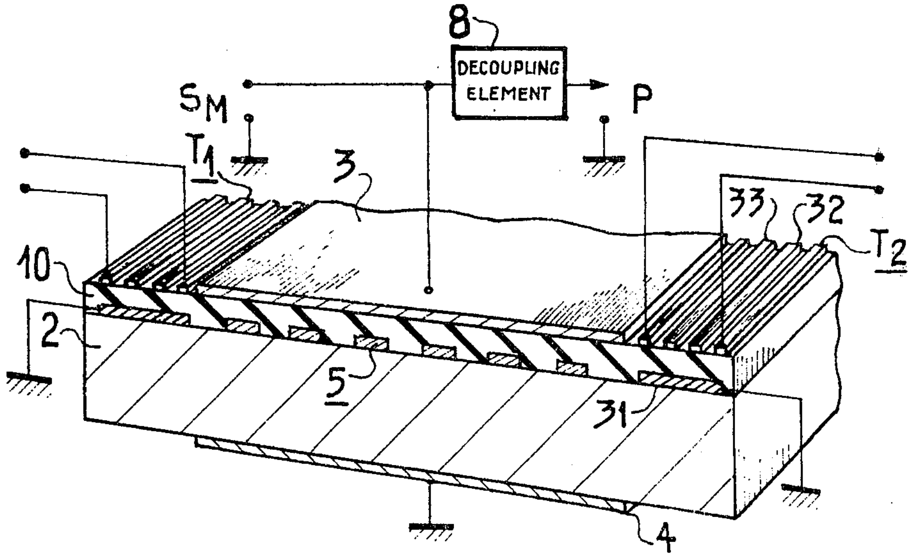

FIG. 2 diagrammatically illustrates one embodiment of the structure according to the invention.

FIG. 2 shows the semiconductor substrate 2 covered over one of its surfaces (in this case the lower surface) by the electrode 4 and, over its other surface, by the network of diodes 5, which are diodes of which the switching time is brief in relation to the period of the signal (for example of the Schottky type) preferably spaced as previously indicated.

The piezoelectric medium is formed by a thin layer 10 (of the order of a fraction of the mean elastic wavelength λ and typically of the order of λ/20) covering the diodes 5. The layer 10 carries for example two electromechanical transducers $T_1$ and $T_2$ in order, as indicated above, to be able to effect convolution and correlation, and, between the transducers, the electrode 3.

In this embodiment for example, the transducers $T_1$ and $T_2$ are each formed by an electrode 31, disposed at the semi-conductor (2)/piezoelectric (10) interface, and two metallic interdigital combs (32 and 33) placed on the layer 10 opposite the electrode 31.

Still by way of example, the semiconductor substrate 2 may with advantage be made of silicon (N-type) and the piezoelectric layer 10 of zinc oxide (ZnO).

In operation, according to a process similar to that described in reference to FIG. 1, the reference signal $S_R$ is applied to one of the transducers, for example $T_1$. It is memorised by the application of a positive voltage pulse ($S_M$) to the electrode 3 if the electrode 4 is kept at the reference potential. The signal S to be identified or, more generally, to be treated is applied, for example, to the same transducer $T_1$. The signal P induced by the non-linear interaction of the signals S and $S_R$ in the semiconductor is extracted between the electrode 3 and the reference potential, by way of a decoupling element 8. The signal P represents the correlation of the signals $S_R$ and S or their convolution if one of them is emitted by the transducer $T_2$.

Figure 3:
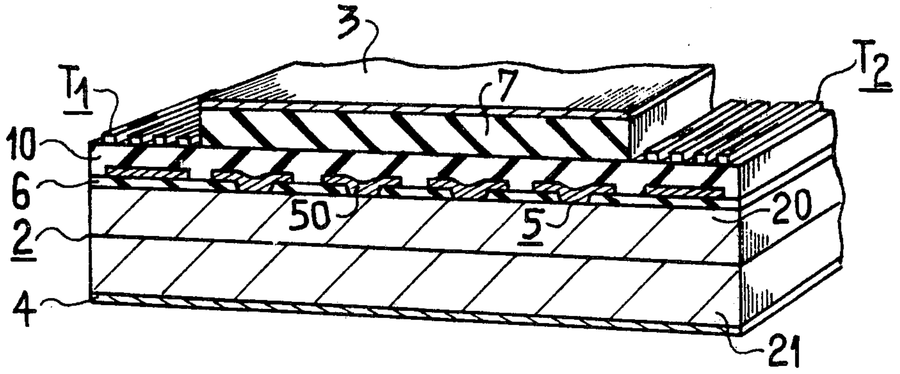
FIG. 3 shows a variant of the structure illustrated in FIG. 2.

FIG. 3 shows a variant of the structure illustrated in the preceding FIG. In FIG. 3, the electrical connections have been omitted for greater clarity.

FIG. 3 shows the semiconductor substrate 2, the piezoelectric layer 10 with its transducers $T_1$ and $T_2$ and the electrodes 3 and 4.

In this case, the substrate 2 comprises two superposed zones: one (21) more heavily doped ($N^+$ in the case of a silicon substrate situated on the side of the electrode 4 to facilitate the ohmic contact, and the other (20) less heavily doped (N or $N^-$) situated on the side of the diodes 5 and intended to reduce the losses of information memorised by these diodes. The surface of the substrate 2 carrying the diodes 5 is covered around the diodes 5 by an insulating layer 6 (for example of silica when the substrate 2 is made of silicon). The layer 6 is intended, on the one hand, to promote the deposition of the piezoelectric layer 10 and to avoid contamination of the semiconductor by the piezoelectric material and, on the other hand, to escape from the effects of recombination of the charge carriers at the surface of the semiconductor.

The diodes 5, of the Schottky type, are formed by metallic studs 50 largely covering the holes formed in the oxide layer 6.

The piezoelectric layer 10 is formed for example by zinc oxide (ZnO) deposited by cathode sputtering onto the oxide 6. It is covered by an insulating layer 7 and, finally, by the electrode 3. The function of the layer 7 is to enable the distance between the electrode 3 and the diodes 5 to be adjusted. In one variant (not shown), this insulating layer 7 may be formed by air.

Figure 4:
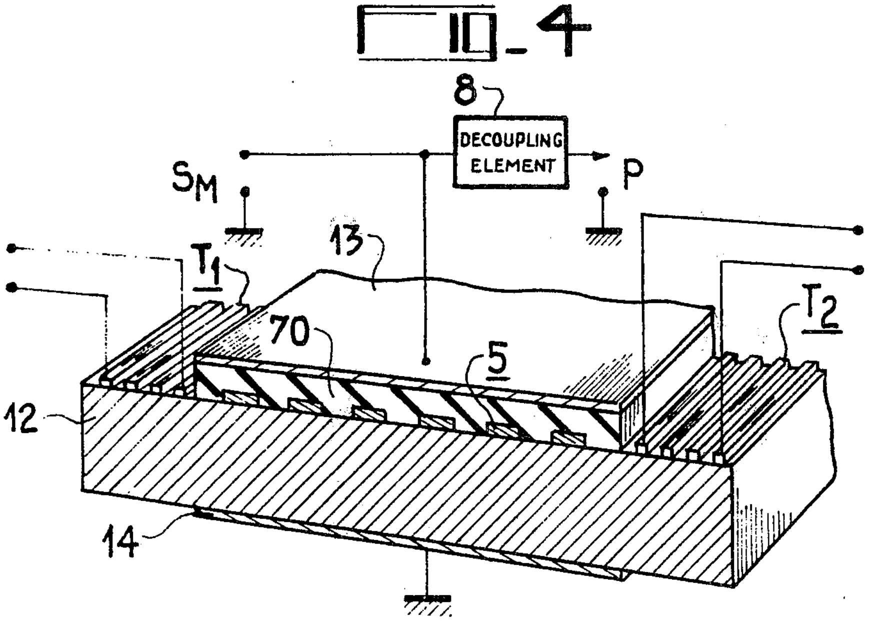
FIG. 4 shows another embodiment of the structure according to the invention.

FIG. 4 shows another embodiment of the structure according to the invention, in which the substrate used combines piezoelectric properties with semiconductive properties.

Accordingly, this FIG. shows:

- a piezoelectric and semiconductive substrate 12, such as gallium arsenide (Ga As) or cadmium sulphide (CdS), which is provided on its lower surface with an electrode 14 and on its upper surface with a network of diodes 5 of the Schottky type;
- two electromechanical transducers $T_1$ and $T_2$ situated on the upper surface of the substrate 12 at two opposite ends thereof; they may each be conventionally formed by two metallic interdigital combs and, in order to improve their efficiency, it is possible to cover them with a layer of material which is more piezoelectric than the substrate 12 (for example zinc oxide);
- an insulating layer 70 deposited on the network of diodes 5 and covered by an electrode 13.

The electrodes 14 and 13 perform the same function and are connected to the same elements as the electrodes 4 and 3 in FIG. 2. More generally, the mode of operation of the embodiment illustrated in FIG. 4 is similar to that illustrated in FIGS. 2 and 3.

There has thus been created a monolithic structure by which it is possible to avoid the stress represented by a critical distance separating the substrates of conventional structures and also the problems of reliability inherent therein. By virtue of the reduction in its thickness, the structure according to the invention also enables the biassing voltages to be applied to obtain a given field to be reduced. Finally, the formation of the structure on a semiconductor substrate enables it to be integrated with an assembly of electronic circuits.

Of course, the invention is not limited to the embodiments described and shown, which were given solely by way of example.

What is claimed is:

1. A surface wave device for treating signals, comprising:
a piezoelectric medium having two opposite surfaces;
at least a first electromechanical transducer for generating elastic waves capable of being propagated on said piezoelectric medium;
a semiconductor medium having two opposite surfaces, the first of its said surfaces, being in contact with the first of said surfaces of the piezoelectric medium, and carrying a mosaic of diodes, the spacing of said diodes being less than half the elastic wavelength;
means for applying a potential difference between the second of said surfaces of the semiconductor medium and the second of said surfaces of the piezoelectric medium, during the propagation of a first signal in said piezoelectric medium so as to memorize that signal by means of said diodes;
means for converting a second signal into an elastic wave propagated in said piezoelectric medium when said first signal is memorized
means for extracting a third signal generated by the interaction of said first and second signals.

2. A device as claimed in claim 1, wherein the thickness of said piezoelectric medium is of the order of a fraction of the wavelength of the elastic waves.

3. A device as claimed in claim 2, wherein the thickness of the piezoelectric medium is substantially equal to one-twentieth of the mean wavelength of the elastic waves.

4. A device as claimed in claim 1, further comprising an insulating layer deposited on said second surface of said piezoelectric medium.

5. A device as claimed in claim 1, wherein said transducer is formed by two electrodes in the form of interdigital combs which are deposited onto said second surface of the piezoelectric medium, and a third electrode, which is continuous, on said first surface of said piezoelectric medium, at the level of said combs.

6. A device according to claim 1, wherein said diodes are of the Schottky type.

7. A device according to claim 1, wherein said means for converting a second signal into an elastic wave comprises said first electromechanical transducer.

8. A device according to claim 1, wherein said means for converting a second signal into an elastic wave comprises a second electromechanical transducer, arranged to generate elastic waves in a direction opposite to the direction of propagation of the elastic waves generated by said first transducer.

9. A device as claimed in claim 1, wherein said first surface of the semiconductor medium is covered with a thin insulating layer between said diodes.

10. A device as claimed in claim 1, wherein said means for applying a potential difference comprises two electrodes respectively deposited onto said second surfaces of the semiconductor medium and of the piezoelectric medium.

11. A device as claimed in claim 10, wherein said means for extracting a third signal are formed by said two electrodes.

12. A surface wave device for treating signals, comprising:
a medium which is both semiconductor and piezoelectric, having two opposite surfaces, said medium carrying a mosaic of diodes on the first of said surfaces;
at least one electromechanical transducer for generating elastic waves capable of being propagated on said first surface, the spacing of said diodes being less than half the leastic wavelength;
means for applying a potential difference between said two opposite surfaces, during the propagation of a first signal on said medium, so as to memorise said first signal in said diodes;
means for converting a second signal into an elastic wave propagating on said medium when said first signal is memorised;
means for extracting a third signal generated by the interaction of said first and second signals.

13. A device as claimed in claim 12, further comprising an insulating layer deposited on said first surface of said medium.

14. A device as claimed in claim 12, wherein said transducer is formed by two electrodes in the form of interdigital combs which are deposited onto said first surface of said medium.

15. A device according to claim 12, wherein said diodes are of the Schottky type.

16. A device according to claim 12, wherein said means for converting a second signal into an elastic wave comprises said first electromechanical transducer.

17. A device according to claim 12, wherein said means for converting a second signal into an elastic wave comprises a second electromechanical transducer, arranged to generate elastic waves in a direction opposite to the direction of propagation of the elastic waves generated by said first transducer.

18. A device as claimed in claim 12, wherein said first surface of said medium is covered with a thin insulating layer between said diodes.

19. A device as claimed in claim 12, wherein said means for applying a potential comprises two electrodes respectively deposited onto said opposite surfaces.

20. A device as claimed in claim 19, wherein said means for extracting a third signal are formed by said two electrodes.

21. A surface wave device for treating signals, comprising:
a semiconductor medium having two opposite surfaces, carrying a mosaic of diodes on the first of said surfaces;
a piezoelectric medium having two opposite surfaces, the first of said surfaces being in contact with said first surface of said semiconductor medium;
at least a first electromechanical transducer for generating elastic waves capable of being propagated on said piezoelectric medium;
means for applying a potential difference between the second of said surfaces of the semiconductor medium and the second of said surfaces of the piezoelectric medium, during the propagation of a first signal in said piezoelectric medium so as to memorize that signal by means of said diodes;

means for converting a second signal into an elastic wave propagated in said piezoelectric medium when said first signal is memorized;

means for extracting a third signal generated by the interaction of said first and second signals, and further comprising an insulating layer deposited on said second surface of said piezoelectric medium.

22. A surface wave device for treating signals, comprising:

a semiconductor medium having two opposite surfaces, carrying a mosaic of diodes on the first of said surfaces;

a piezoelectric medium having two opposite surfaces, the first of said surfaces being in contact with said first surface of said semiconductor medium;

at least a first electromechanical transducer for generating elastic waves capable of being propagated on said piezoelectric medium;

means for applying a potential difference between the second of said surfaces of the semiconductor medium and the second of said surfaces of the piezoelectric medium, during the propagation of a first signal in said piezoelectric medium so as to memorize that signal by means of said diodes;

means for converting a second signal into an elastic wave propagated in said piezoelectric medium when said first signal is memorized;

means for extracting a third signal generated by the interaction of said first and second signals, and wherein said transducer is formed by two electrodes in the form of interdigital combs which are deposited onto said second surface of the piezoelectric medium, and a third electrode, which is continuous, on said first surface of said piezoelectric medium, at the level of said combs.

23. A surface wave device for treating signals, comprising:

a semiconductor medium having two opposite surfaces, carrying a mosaic of diodes on the first of said surfaces;

a piezoelectric medium having two opposite surfaces, the first of said surfaces being in contact with said first surface of said semiconductor medium;

at least a first electromechanical transducer for generating elastic waves capable of being propagated on said piezoelectric medium;

means for applying a potential difference between the second of said surfaces of the semiconductor medium and the second of said surfaces of the piezoelectric medium, during the propagation of a first signal in said piezoelectric medium so as to memorize that signal by means of said diodes;

means for converting a second signal into an elastic wave propagated in said piezoelectric medium when said first signal is memorized;

means for extracting a third signal generated by the interaction of said first and second signals, and wherein said first surface of the semiconductor medium is covered with a thin insulating layer between said diodes.

* * * * *